U S 0 0 5 4 0 4 3 3 3 A

United States Patent [19]

Mehta

[11] Patent Number: 5,404,333
[45] Date of Patent: Apr. 4, 1995

[54] AMPLIFIER WITH ACTIVELY CLAMPED LOAD

[75] Inventor: Aswin N. Mehta, Houston, Tex.

[73] Assignee: Texas Instruments, Inc., Dallas, Tex.

[21] Appl. No.: 36,583

[22] Filed: Mar. 24, 1993

Related U.S. Application Data

[62] Division of Ser. No. 718,053, Jun. 20, 1991, Pat. No. 5,206,550.

[51] Int. Cl.[6] .................. G11C 7/00; G01R 19/00
[52] U.S. Cl. .................. 365/208; 365/189.06; 327/52; 327/309
[58] Field of Search .............. 365/207, 208, 189.06, 365/227; 307/530, 540

[56] References Cited

U.S. PATENT DOCUMENTS

| | | | |
|---|---|---|---|
| 4,604,533 | 8/1986 | Miyamoto et al. | 365/208 |
| 4,862,421 | 8/1989 | Tran | 365/208 X |
| 4,899,311 | 2/1990 | Petschauer et al. | 365/189.06 |
| 5,012,450 | 4/1991 | Mattausch et al. | 365/208 |
| 5,016,214 | 5/1991 | Laymoun | 365/189.06 |
| 5,091,886 | 2/1992 | Miyawaki et al. | 365/189.06 |
| 5,144,171 | 9/1992 | Huard | 307/530 |

Primary Examiner—Eugene R. LaRoche
Assistant Examiner—Son Dinh
Attorney, Agent, or Firm—Richard B. Havill; Richard L. Donaldson

[57] ABSTRACT

An amplifier is arranged with an actively clamped load. In a differential amplifier, a pair of emitter-coupled transistors has loads connected between the collectors and a voltage supply. Separate clamping transistors have their collector-emitter paths connected across respective ones of the loads. A clamping control circuit, responsive to an input signal, produces a variable control signal to clamp output signal swings across the loads. A similar clamping control circuit can be used with a single-ended amplifier. Such an amplifier having an actively clamped load is useful in sense amplifier circuit arrangements in semiconductor memory arrangements used in data processing systems.

12 Claims, 6 Drawing Sheets

(PRIOR ART)

TIME IN NSEC
(PRIOR ART)
FIG. 7

TIME IN NSEC
(PRIOR ART)
FIG. 8

AMPLIFIER WITH ACTIVELY CLAMPED LOAD

This is a division of application Ser. No. 07/718,053, filed Jun. 20, 1991, U.S. Pat. No. 5,206,550.

FIELD OF THE INVENTION

This invention relates to an amplifier with a clamped load.

BACKGROUND OF THE INVENTION

A conventional bipolar semiconductor differential amplifier includes a matched pair of loads (active or passive) connected between the collector electrodes of a pair of emitter-coupled transistors and the supply voltage. A current source is connected between the common emitters of the pair of transistors and ground reference. Input signals are applied to the base electrodes of the pair of transistors, and output signals are taken from the collector electrodes. In a semiconductor memory system, the inputs originate from signals that occur on bit lines of an array of memory cells.

During operation, when the emitter current source is enabled, the differential input signals cause one transistor of the pair to increase conduction and the other to decrease conduction. As a detector in a digital system, such as a semiconductor memory system, the conducting transistor conducts all of the emitter current and the other is cutoff.

It is desirable to design the differential amplifier to operate very fast, i.e., to switch states very rapidly. Input differential signals are applied through a D.C. voltage shifter to the gate electrodes of the pair of transistors of the differential amplifier. In an effort to speed up operation, designers have increased the gain of the circuit by increasing the load, e.g., by increasing the value of the load resistance. Gain is proportional to the value of the load. The increased load causes large voltage swings at the collector output terminals and can cause the amplifier circuit to go into saturation. If the amplifier circuit goes into saturation, it slows down and also may latch-up.

To avoid excessive collector voltage swings, the collector electrodes have been clamped by diode-connected transistors positioned across the loads of the differential pair of transistors. If a single diode-connected transistor is used on each side of the differential pair, the swing of the collector voltage is limited to a single diode voltage drop. If two diode-connected transistors are connected in series across the load on each side of the differential amplifier, the swing of the collector voltage is limited to two diode voltage drops. By thus clamping the collector voltage, the differential amplifier output signal swings are a fixed value for large loads. Since clamping is determined by the supply voltage that is local to the collectors of the differential amplifier, there is no clamp voltage tracking of the variations in either the D.C. voltage level or the A.C. signal strength of the input differential signal that is applied to the base electrodes of the differential amplifier. To safeguard against this drawback, one has to either severely limit the gain of the differential amplifier by using small loads and slow speed or run the risk of forward-biasing the base-to-collector junctions of the transistors of the differential amplifier and possible latch-up.

The problem is to design a differential amplifier circuit that operates very fast with either a high voltage or a low voltage collector supply. The circuit should not be slow when installed with a low voltage supply nor driven into saturation or caused to latch-up when installed with a high voltage supply.

This problem is not unique to a differential amplifier. A single-ended input/output amplifier is confronted by the same problem.

SUMMARY OF THE INVENTION

These problems and others are resolved by a differential amplifier arrangement including first and second emitter-coupled transistors and an emitter current source. First and second loads are connected between the respective collector electrodes of the first and second transistors and a voltage supply. First and second clamping transistors, each has its collector-emitter path connected across a respective one of the loads. A clamping control circuit, responsive to an input signal, produces and applies variable control signals to base electrodes of the first and second clamping transistors for clamping output signal swings across the first and second loads.

Similarly a single-ended amplifier arrangement includes a first transistor having an emitter electrode coupled through a current source to a reference potential. A load is connected between a collector electrode of the first transistor and a voltage supply. A clamping transistor has a collector-emitter path connected across the load. A clamping control circuit, responsive to an input signal, produces and applies a variable control signal to a base electrode of the clamping transistor for clamping output signal swings across the load.

A data processing system incorporates a data processor interconnected with a memory by way of an address bus, a data bus, and a control bus. The memory includes a sense amplifier arranged with an actively clamped load that is responsive to changes in the D.C. voltage level and the magnitude of the signal on an associated bit line or bit lines from the memory.

BRIEF DESCRIPTION OF THE DRAWING

A better understanding of the invention may be derived by reading the subsequent detailed description with reference to the drawing wherein.

DETAILED DESCRIPTION

Figure 1:
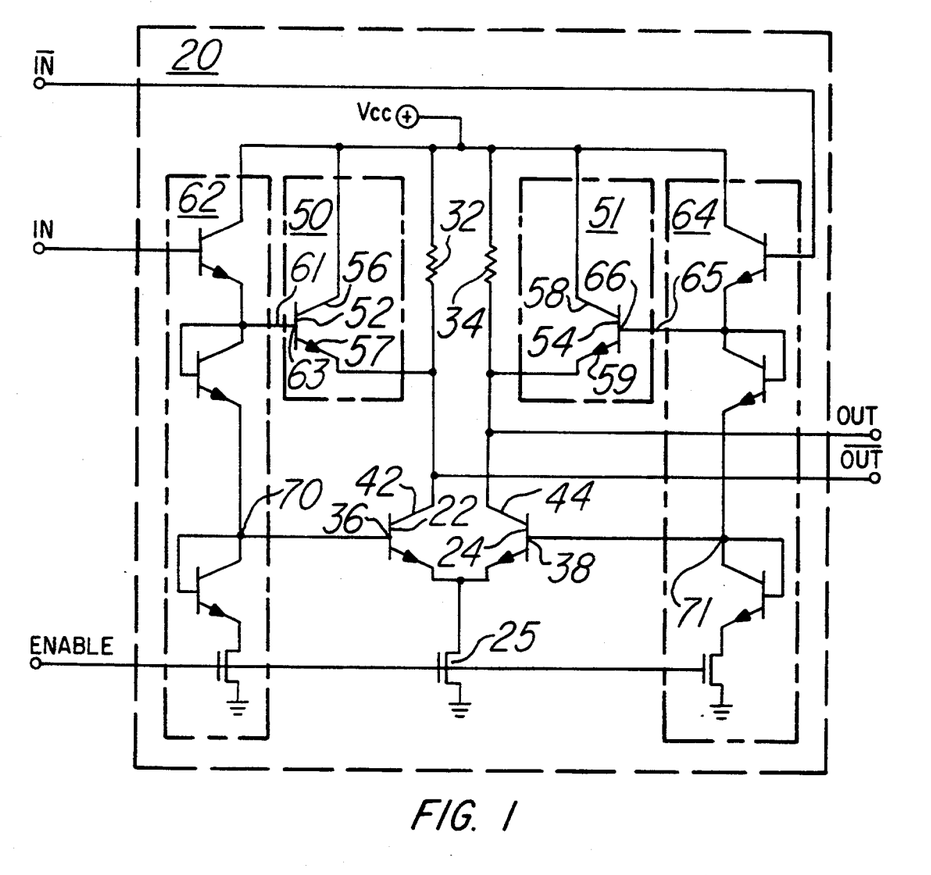
FIG. 1 is a schematic diagram of a differential amplifier circuit.

Referring now to FIG. 1, there is shown an actively clamped differential amplifier 20 that includes a matched pair of emitter-coupled NPN bipolar transistors 22 and 24, the emitters of which are connected to a current source 25. The current source 25 also connects with ground reference potential. When enabled, the current source 25 assures a consistent magnitude of current is supplied to the emitters of the transistors 22 and 24. Load resistors 32 and 34 are connected between the collector electrodes of the respective transistors 22 and 24 and a collector supply voltage $V_{cc}$. Input signals are applied to the differential amplifier 20 at input terminals IN and $\overline{IN}$ and through intervening circuitry to the base electrodes 36 and 38 of the transistors 22 and 24. Output signals for the differential amplifier are produced at the output terminals $\overline{OUT}$ and OUT connected to the collector electrodes 42 and 44 of the respective transistors 22 and 24.

Special active clamping circuits 50 and 51 are used for clamping swings of voltage across both load resistors 32 and 34 to values that depend upon the D.C. supply voltage level and the magnitude of the signal produced by a preceding circuit (not shown) and upon the collector supply voltage $V_{cc}$ of the differential amplifier 20. In the active clamping circuit 50, an NPN clamping transistor 52 has its collector electrode 56 connected to the collector supply voltage $V_{cc}$ and its emitter electrode 57 connected to the collector electrode of the NPN transistor 22. A clamping control signal is applied from a voltage splitter circuit 62 by way of a lead 61 to the base electrode 63 of the NPN clamping transistor 52. Similarly, in the active clamping circuit 51, the collector electrode 58 and emitter electrode 59 of another clamping transistor 54 are connected, respectively, to the collector supply voltage $V_{cc}$ and to the collector electrode of the NPN transistor 24. A clamping control signal is applied from another voltage splitter circuit 64 by way of a lead 65 to the base electrode 66 of the NPN clamping transistor 54.

The differential input signals, applied to the input terminals IN and $\overline{IN}$ of the actively clamped differential amplifier, are coupled through voltage splitter circuits 62 and 64 to the base electrodes 63 and 66 of the clamping transistors 52 and 54 and to the base electrodes 36 and 38 of the NPN transistors 22 and 24. The source of input signals may be characterized either as a relatively high capacitance source, such as long bit lines in a random access semiconductor memory, or a relatively low capacitance source. For either of the aforementioned input signal sources, the supply voltage level may be any value in a relatively wide range, such as four volts to six volts. Differential input signals applied to the input terminals IN and $\overline{IN}$ of the actively clamped differential amplifier 20 and representing true and complement logic signals, may be in a range from 100 millivolts to 200 millivolts. Thus, the input signals applied to the input terminals IN and $\overline{IN}$ may vary by both their D.C. voltage level and the differential voltage range depending upon the environment and circumstances where the differential amplifier 20 is used.

As a result of the possible variations of the input signals, the voltage splitter circuits 62 and 64 produce variable clamping control signals on the leads 61 and 65. The variable clamping control signals may have variations both in D.C. voltage level and in the differential voltage range. In response to both types of variations of the clamping control signals, the operation of the differential amplifier 20 is improved with respect to previously known clamped differential amplifier arrangements.

Next we shall describe the operation of the actively clamped differential amplifier of FIG. 1. When a signal ENABLE is a low level, the circuit arrangement is disabled because there is no emitter circuit current for the pair of emitter-coupled transistors 22 and 24 and because both voltage splitter circuits 62 and 64 are disabled. The differential amplifier is enabled when the signal ENABLE is high allowing conduction from the supply voltage $V_{cc}$ through both the voltage splitter circuits 62 and 64 to the ground reference and through the differential pair and the current source 25 to ground reference. When the voltage splitter circuits 62 and 64 are enabled and current is conducted through them, the variable clamping control signals on the leads 61 and 65 will be one diode voltage drop below the input signals on the input terminals IN and $\overline{IN}$, respectively.

With the circuit arrangement enabled, the input signals on the input terminals IN and $\overline{IN}$ control operation of the differential pair of transistors 22 and 24. Because the voltage splitter circuits are enabled, the voltages on the nodes 70 and 71 are two diode voltage drops below the input signals on the input terminals IN and $\overline{IN}$, respectively. Since the input signals are complementary, the transistors 22 and 24 conduct alternatively. Turn-on and turn-off signals from nodes 70 and 71 of the voltage splitter circuits are applied, respectively, to the base electrodes 36 and 38 of the transistors 22 and 24. The turn-on signal is, for example, a high level voltage of the input signal on the input terminal IN. A complementary low level voltage input signal, which concurrently occurs on the input terminal $\overline{IN}$, keeps the transistor 24 turned off.

Figure 2:
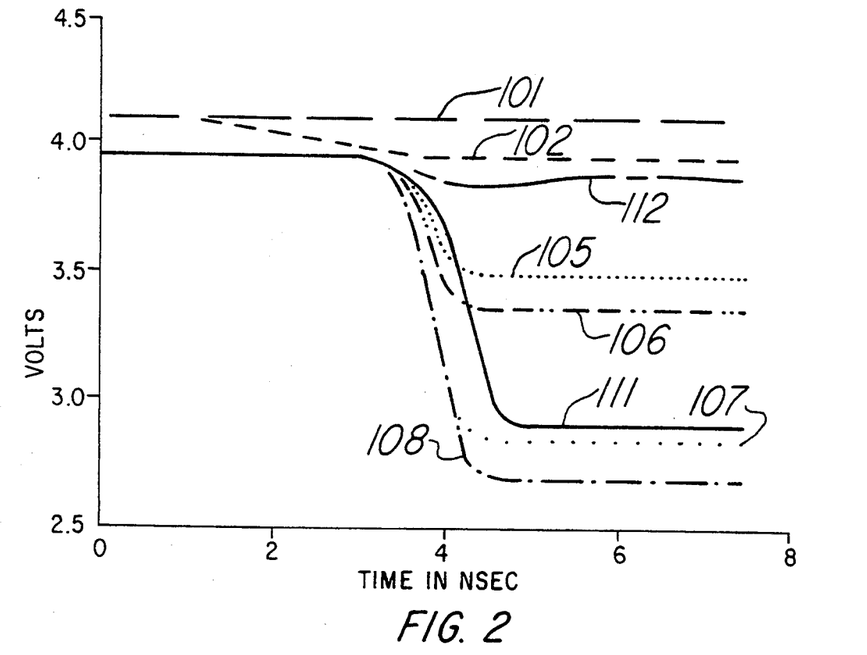
FIG. 2 shows operating curves of the circuit of FIG. 1 when it has a large load and is connected to a low voltage supply.

Referring now to FIG. 2, there are shown some operating curves for the circuit arrangement of FIG. 1 operating with a relatively low supply voltage approximating 4.2 volts. The curves show operation with respect to the transistor 22 being initially turned off and then turned on by the applied input signals. Input signals 101 and 102, respectively, are applied to the input terminals IN and $\overline{IN}$. Their final steady state differential voltage is approximately 150 millivolts. Clamping control signals 105 and 106 occur on leads 61 and 65, respectively, and are at one diode voltage drop below the input signals 101 and 102. Turn-on and turn-off signals 107 and 108 are one diode voltage drop below the signals 105 and 106 and are applied to the base electrodes 36 and 38, respectively. Output signals 111 and 112 are produced on terminals $\overline{OUT}$ and OUT, respectively. It is noted that output signal 111, on the collector of the NPN transistor 22, effectively reaches a low level which is near the low level of the signal 107 applied to the base of the NPN transistor 22. Since these voltages are near the same level, there is little or no risk of forward-biasing the base-collector junction of the transistor 22 or of latch-up of the circuit when the transistor 22 is turned on. Although it is not shown, similar operating curves apply to the circuit when the transistor 24 is turned on and the transistor 22 is turned off. Identification numerals change accordingly for the operating curves.

Figure 3:
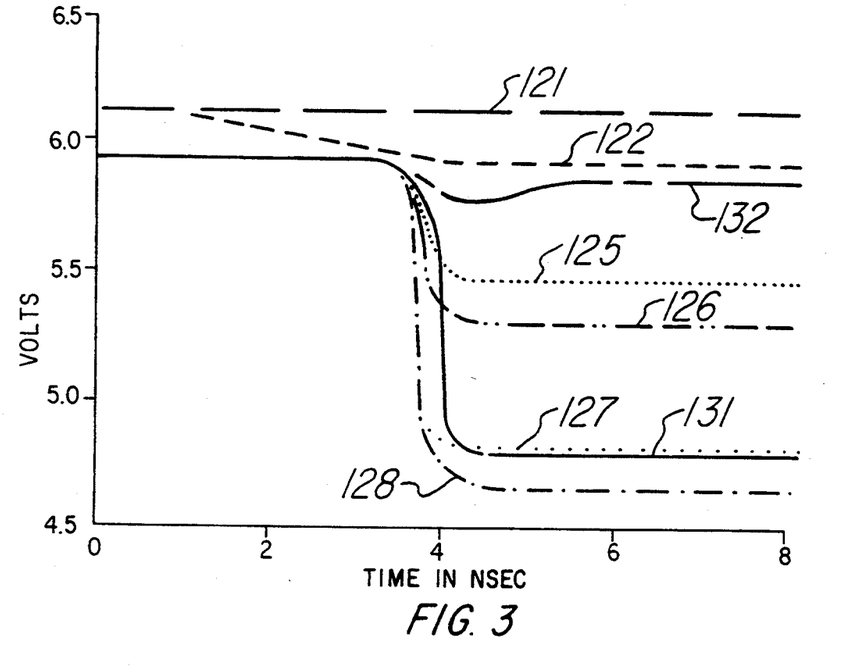
FIG. 3 shows operating curves of the circuit of FIG. 1 when it has a large load and is connected to a high voltage supply.

Referring now to FIG. 3, there are shown operating curves for the circuit of FIG. 1 operating with a supply voltage of approximately 6.2 volts. Again transistor 22 initially is turned off and then is turned on. Input signals 121 and 122 are applied to input terminals IN and $\overline{\text{IN}}$. Their final steady state differential voltage is approximately 200 millivolts. Clamping control signals 125 and 126, on leads 61 and 65, are one diode voltage drop below the input signals 101 and 102 and are one diode voltage drop above the turn-on and turn-off signals 127 and 128, respectively. Output signals 131 and 132 are produced on terminals $\overline{\text{OUT}}$ and OUT, respectively. It is noted that output signal 131, on the collector electrode of the NPN transistor 22, effectively reaches a low level which is near the low level of the signal 127 applied to the base electrode of NPN transistor 22. There is little or no risk of substantially forward-biasing the base-collector junction of the transistor 22 or of latch-up of the circuit when the transistor 22 is turned on.

With respect to the circuit operations represented by the operating curves presented in FIGS. 2 and 3, the following characteristics are readily apparent. Changes in the magnitude of the input differential voltage cause similar changes in the magnitude of the clamping control differential voltage applied between the leads 61 and 65. Similarly changes in the d.c. level of the input signals cause changes in the d.c. levels of the clamping control signals on the leads 61 and 65. As a result, the output differential voltage is relatively consistent regardless of the changes of input differential voltage or of the input signal level. A large output differential voltage for operating any subsequent stage (not shown) is available by 4.5 nsec in each of the FIGS. 2 and 3. Fast operation is assured under the wide variations of input signal conditions presented.

Figure 4:
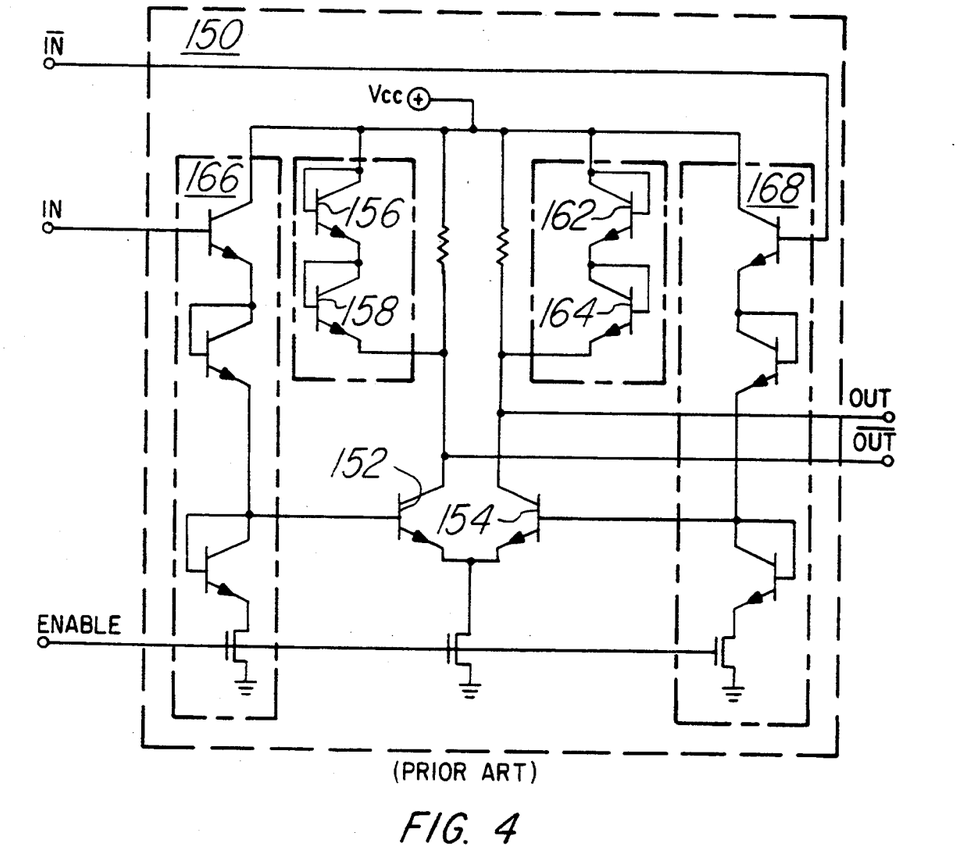
FIG. 4 is a schematic diagram of a prior art differential amplifier circuit having two diodes in a series circuit for clamping output signals.

Referring now to FIG. 4, there is shown a prior art clamped differential amplifier 150 including a pair of NPN transistors 152 and 154 connected with load resistors and a common emitter current source. For the transistor 152, two diode-connected transistors 156 and 158, connected in series, clamp swings of the output voltage on output terminal $\overline{\text{OUT}}$ at a level that is two diode voltage drops below the level of the supply voltage $V_{cc}$. Similarly diode-connected transistors 162 and 164 clamp swings of output voltage on the output terminal OUT at two diode voltage drops below the supply voltage $V_{cc}$. Complementary input signals on input terminals IN and $\overline{\text{IN}}$ are applied through voltage shifter circuits 166 and 168 to the base electrodes of the NPN transistors 152 and 154, respectively. An enabling signal is applied to the terminal ENABLE. Corresponding complementary output signals are produced at output terminals OUT and $\overline{\text{OUT}}$. Exemplary operating signals are shown in FIGS. 5 through 8.

Figure 5:
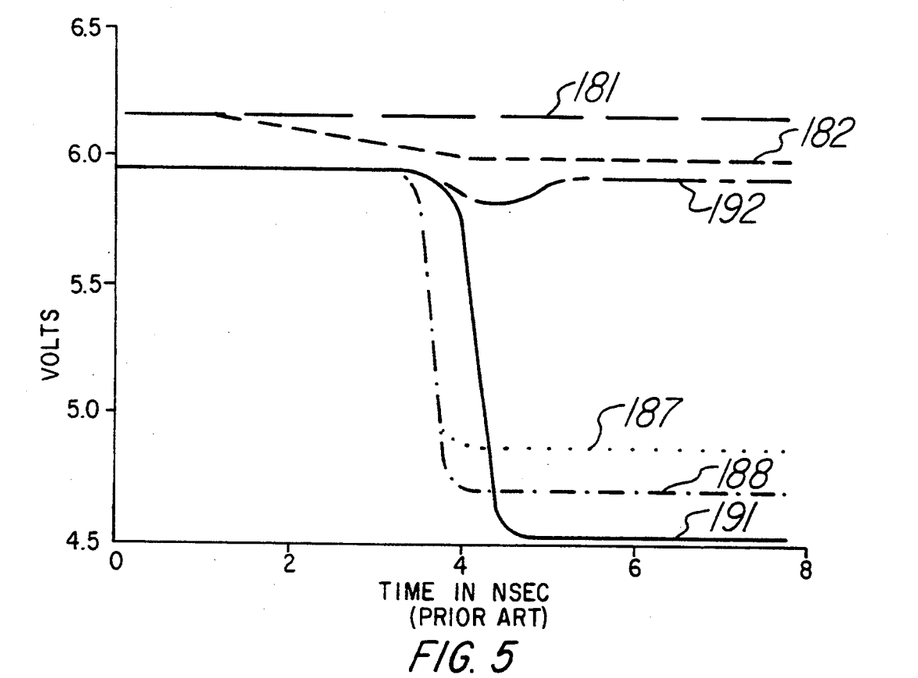
FIG. 5 shows operating curves of the prior art circuit of FIG. 4 when it has a large load and is connected to a high voltage supply.

Referring now to FIG. 5, there are shown operating curves for the circuit of FIG. 4 operating with load resistors equal to the load resistors used in the arrangement of FIG. 1 for producing the operating curves of FIGS. 2 and 3 with a supply voltage of approximately 6.2 volts. Input signals 181 and 182 are applied to input terminals IN and $\overline{\text{IN}}$, respectively, of FIG. 4. Their steady state differential voltage is approximately 200 millivolts. Output signals 191 and 192 are produced on terminals $\overline{\text{OUT}}$ and OUT, respectively. There are no clamping control signals, but the low level output signal is clamped at approximately two diode voltage drops below the supply voltage $V_{cc}$. Differential signals, applied to the base electrodes of the NPN transistors 152 and 154, are signals 187 and 188 which are at approximately two diode voltage drops below the input signals 181 and 182, respectively. It is noted that output signal 191, on the collector electrode of the NPN transistor 152, effectively reaches a low level which is substantially below the low level of the signal 187 applied to the base electrode of the NPN transistor 152. The voltage difference may be some 400-800 millivolts of forward bias that creates a substantial risk of latch-up of the circuit. If there is no saturation and/or latch-up, the circuit operates approximately as fast as the arrangement of FIG. 1.

Figure 6:
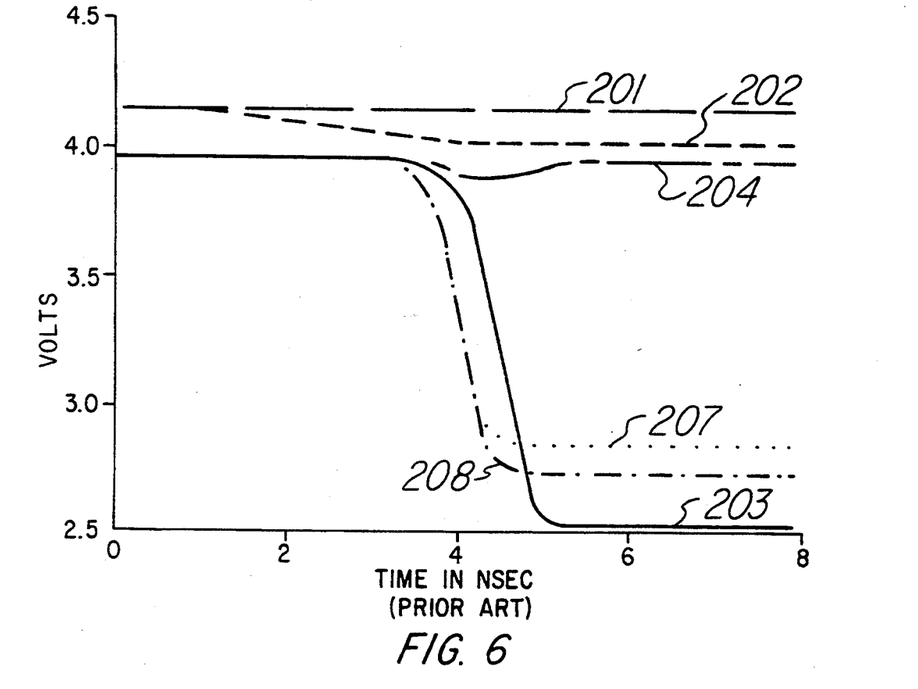
FIG. 6 shows operating curves of the prior art circuit of FIG. 4 when it has a large load and is connected to a low voltage supply.

Referring now to FIG. 6, there are shown operating curves for the circuit of FIG. 4 operating with the large load resistors used for producing the curves of FIGS. 2, 3 and 5 but with a supply voltage $V_{cc}$ of approximately 4.2 volts. Input signals 201 and 202 are applied to the input terminals IN and $\overline{\text{IN}}$, respectively, of FIG. 4. Their steady state differential voltage is approximately 150 millivolts. Output signals 203 and 204 occur on terminals $\overline{\text{OUT}}$ and OUT, respectively. There are no clamping control signals, but the low level output signal is clamped at approximately two diode voltage drops below the supply voltage $V_{cc}$. The differential signals, applied to the base electrodes of the transistors 152 and 154, are signals 207 and 208 at approximately two diode voltage drops below the input signals 201 and 202, respectively. Output signal 203, on the collector electrode of the NPN transistor 152, effectively reaches a low level that is substantially below the low level of the signal 207 on the base electrode of the transistor 152. This voltage may be some 400-800 millivolts of forward bias on the base-collector junction of the transistor 152, thereby creating a substantial risk of saturation and/or latch-up of the circuit. Because of the lower supply voltage, the output differential signal achieves a large difference much later than the circuit operations presented in FIGS. 2, 3, and 5.

Figure 7:
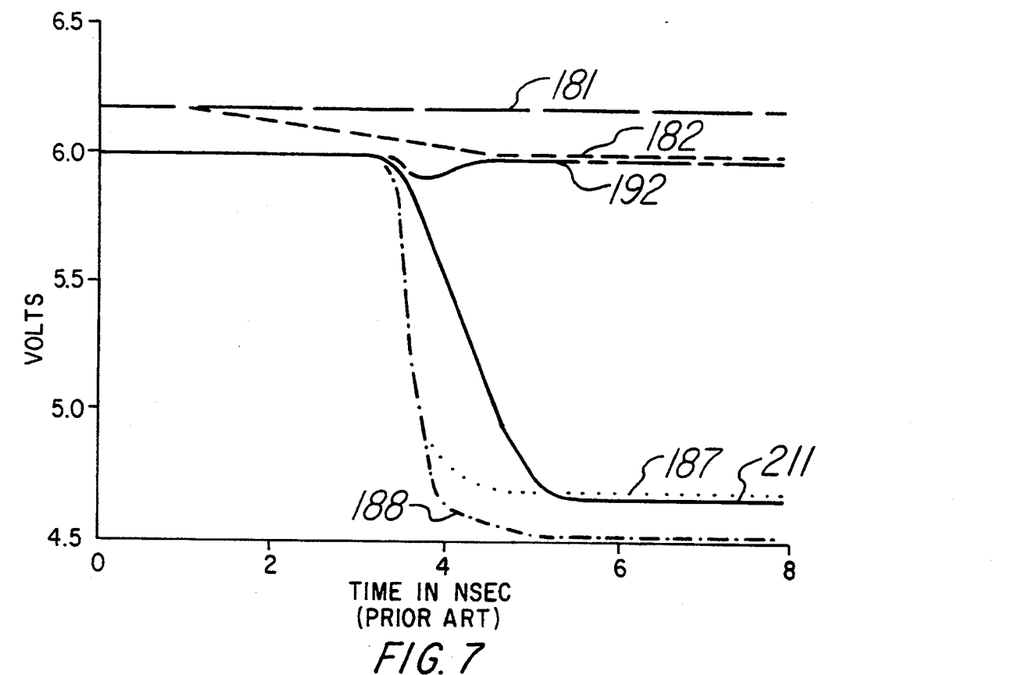
FIG. 7 shows operating curves of the prior art circuit of FIG. 4 when it has a small load and is connected to a high voltage supply.
Figure 8:
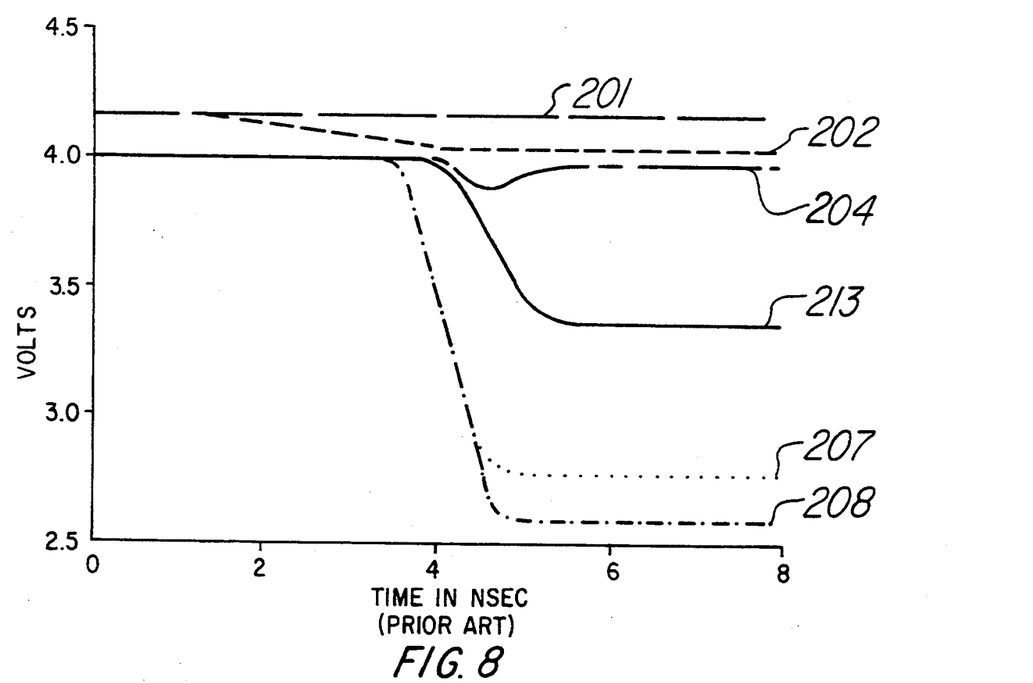
FIG. 8 shows operating curves of the prior art circuit of FIG. 4 when it has a small load and is connected to a low voltage supply.

In the prior art to avoid the possibility of latch-up of the circuit, designers have used a small load to assure that the steady state low output signal level is approximately equal to the high input signal level applied to the enabled transistor 152. FIGS. 7 and 8 present operating curves for the prior art circuit of FIG. 4 with load resistances equal to approximately one-half of the load resistances used for the circuit arrangement which produced the curves of FIGS. 5 and 6.

Referring now to FIG. 7, there are shown operating curves for the circuit of FIG. 4 operating with load resistances equal to approximately one-half of the resistances of the loads used in the arrangements for producing the operating curves presented in FIGS. 2, 3, 5, and 6. Supply voltage is approximately 6.2 volts. Numerical designators for the curves of FIG. 5 are reused in FIG. 7 where comparable signals occur at the same circuit locations. Input signals 181 and 182 are applied to input terminals IN and $\overline{\text{IN}}$. Their steady state differential voltage is approximately 200 millivolts. Output signals 211 and 192 are produced on terminals $\overline{\text{OUT}}$ and OUT, respectively. It is noted that output signal 211, on the collector electrode of the transistor 152, has a steady low state that is approximately the same as the low level of signal 187 applied to the base electrode of NPN transistor 152. Although the risk of forward-biasing the base-collector junction and latch-up is low, the output signals 211 and 192 reach their steady state differential values much slower than the arrangement with the larger load resistors (output signal curves of FIG. 5).

Referring now to FIG. 8, there are shown operating curves for the circuit of FIG. 4 operating with load resistances, as used to produce the curves of FIG. 7. Supply voltage is approximately 4.2 volts. Numerical designators for the curves of FIG. 8 are the same as used in FIG. 6 except where signals are not similar. Input signals 201 and 202 are applied to the input terminals IN and $\overline{\text{IN}}$. Their steady state differential voltage is approximately 150 millivolts. Output signals 213 and 204 are produced on the terminals $\overline{\text{OUT}}$ and OUT, respectively. The output signal 213, on the collector electrode of the NPN transistor 152, has a steady state low level that is so far above the signal 207, which is applied to the base electrode of the transistor 152, that there is no concern of latch-up of the circuit. On the other hand, the load resistance is so small that the voltage drop across the load levels out at the relatively high steady state voltage because of the limit of the emitter current. The diode-connected transistors 156 and 158 are not forward-biased enough to conduct. It is noted that the steady state differential output voltage, between the output signals 213 and 204, is a considerably smaller voltage than that available in the operations presented in FIGS. 2, 3, 5, 6 and 7. Also the steady state differential output occurs later than the steady state differential output signals in the other operations just mentioned.

It is noted that no such slow down occurs with respect to the arrangement of FIG. 1 with the operating curves shown in FIGS. 2 and 3. The exemplary variations of supply voltage and input differential signal make no substantial difference in the operating speed of applicant's arrangement of FIG. 1. The active clamping arrangement produces variable clamping control signals, which clamp the output signal in response to the combination of the applied input differential signal and the level of the input supply voltage.

Heretofore in this description, the examples of the actively clamped amplifier are presented as differential amplifiers. It is clear, however, from the foregoing description that the actively clamped amplifier can be configured as a single-ended amplifier to produce the operating curves of FIGS. 2 and 3. The principle difference is that a single-ended signal is applied to the input terminal and a single-ended output signal is produced at the output terminal.

Figure 9:
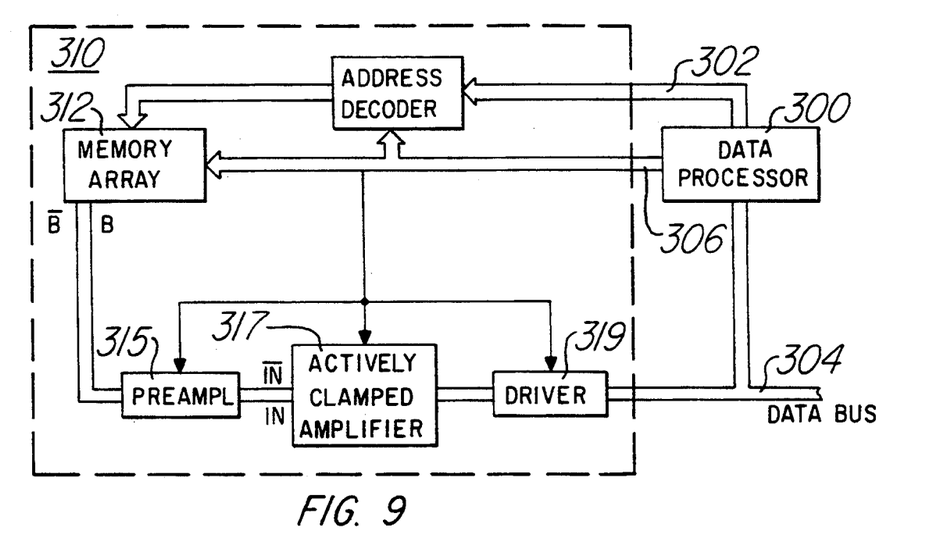
FIG. 9 is a block diagram of a data processor system using a memory including an actively clamped sense amplifier.

Referring now to FIG. 9, there is shown a data processing system, including a data processor 300, which is interconnected by way of an address bus 302, a data bus 304, and a control bus 306 with a memory arrangement 310. During operation of the data processor 300, data are accessed from a memory array 312 and appear on a pair of complementary bit lines B and $\overline{\text{B}}$. Those bit lines are considered to be fairly long and to have a relatively large effective capacitance. They are, for exemplary purposes, pre-amplified in a pre-amplifier 315 and then applied to an actively clamped differential amplifier 317, arranged in accordance with the arrangement of FIG. 1. The pre-amplifier 315 serves to decouple the large capacitance of the bit lines from the input to the actively clamped differential amplifier 317. The differential output signal from the actively clamped differential amplifier 317 thereafter is applied to a driver circuit 319 before being transmitted through the data bus 304 to the data processor 300. Because of the advantageous arrangement of the actively clamped differential amplifier 317, the preamplifier 315 may operate at a relatively low power supply voltage and produce a relatively low differential voltage output signal. The actively clamped differential amplifier 317 responds to the weak differential signal or to a strong differential signal and quickly produces a large differential voltage output signal for application to the driver circuit 319. A steady state differential voltage output signal is produced very rapidly with consistent differential voltage so that the driver circuit 319 can respond very quickly.

Figure 10:
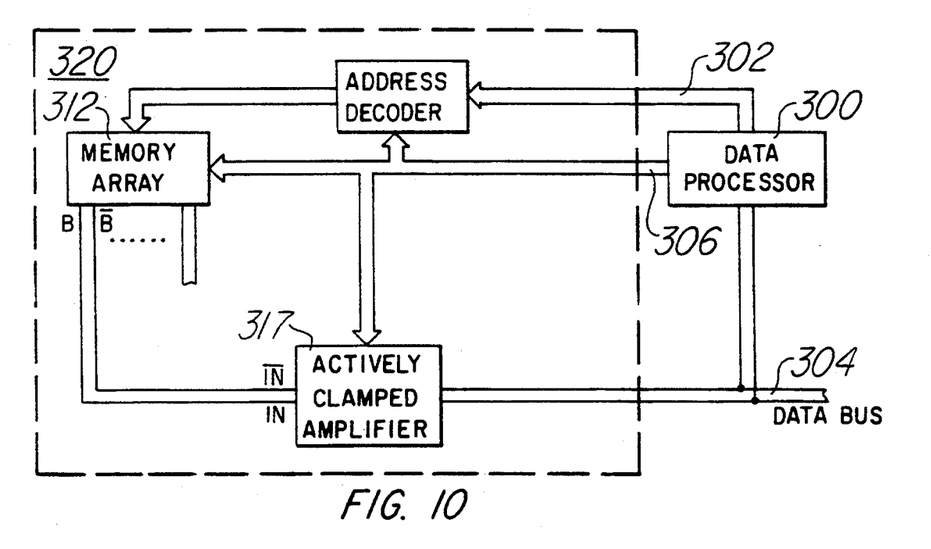
FIG. 10 is a block diagram of another data processor system using a memory including an actively clamped sense amplifier.

Referring now to FIG. 10, there is shown a data processing system including the data processor 300 that is interconnected by the address bus 302, the data bus 304, and the control bus 306 with a memory arrangement 320. Bit lines $\overline{\text{B}}$ and B from the memory array 312 are considered to have much less capacitance than for the arrangement of FIG. 9. Consequently, the bit lines $\overline{\text{B}}$ and B are directly connected to the input terminals of the actively clamped differential amplifier 317, which is arranged in accordance with the circuit arrangement of FIG. 1. The output differential signal produced by the differential amplifier 317 has sufficient differential voltage and a fast enough speed so that the output signal is transmitted directly on the data bus 304 to the data processor 300.

The foregoing describes some embodiments of the invention. Those embodiments together with other embodiments made obvious in view thereof fall within the scope of the appended claims.

What is claimed is:

1. A semiconductor memory arrangement comprising:
    an array of storage cells arranged in plural addressable rows and columns;
    row addressing means, responsive to row address signals, for selecting a row of storage cells;
    column addressing means, responsive to column address signals, for selecting at least one column of storage cells;
    a plurality of bit lines, each bit line associated with a column of storage cells;
    a plurality of sense amplifiers, each sense amplifier associated with a different column of storage cells; and
    each sense amplifier including an actively clamped load that clamps signal swings across the sense amplifier load in response to a D.C. voltage level and a signal magnitude on the associated bit line.

2. A data processing system comprising:
    a data processor;
    a memory arrangement;
    an address bus, a data bus, and a control bus interconnecting the data processor with the memory arrangement;
    the memory arrangement including:
        a column of storage cells associated with a bit line for reading data from the storage cells;
        a sense amplifier coupled to the bit line for sensing the data read from the storage cells; and
        the sense amplifier having an actively clamped load for clamping signal swings across the sense amplifier load in response to a D.C. voltage level and a signal magnitude on the bit line.

3. A data processing system comprising:
    a data processor;
    a memory arrangement;

an address bus, a data bus, and a control bus interconnecting the data processor with the memory arrangement;

the memory arrangement including:
- a column of storage cells associated with a bit line for reading data from the storage cells;
- a sense amplifier coupled to the bit line for sensing the data read from the storage cells;
- the sense amplifier having:
  - an actively clamped load for clamping signal swings across its load in response to a D.C. voltage level and a signal magnitude on the bit line;
  - first and second emitter-coupled transistors;
  - a current source connected between the emitters of the first and second emitter-coupled transistors and a reference potential;
  - first and second loads are connected between the respective collector electrodes of the first and second emitter-coupled transistors and a voltage supply;
  - first and second clamping transistors, each has its collector-emitter path connected across a respective one of the loads; and
  - a clamping control circuit, responsive to an input signal, for producing and applying to base electrodes of the first and second clamping transistors variable control signals to clamp output signal swings across the first and second loads.

4. A data processing system, in accordance with claim 3, wherein
the control signals change with the D.C. voltage level of the input signal.

5. A data processing system, in accordance with claim 3, wherein
the control signals vary with the magnitude of the input signal.

6. A data processing system, in accordance with claim 3, wherein
output signal swings vary in response to the differences in the control signals.

7. A differential amplifier, in accordance with claim 3, wherein
the first and second clamping transistors, when operated, are operated continuously with voltage gain in a linear region of their operating characteristics.

8. A semiconductor memory arrangement comprising:
an array of storage cells arranged in plural addressable rows and columns;
row addressing means, responsive to row address signals, for selecting a row of storage cells;
column addressing means, responsive to column address signals, for selecting at least one column of storage cells;
a plurality of bit lines, each bit line associated with a column of storage cells;
a plurality of sense amplifiers, each sense amplifier associated with a different column of storage cells;
each sense amplifier including:
- an actively clamped load that clamps signal swings across its load in response to a D.C. voltage level and a signal magnitude on the associated bit line;
- first and second emitter-coupled transistors;
- a current source connected between the emitters of the first and second emitter-coupled transistors and a reference potential;
- first and second loads are connected between the respective collector electrodes of the first and second emitter-coupled transistors and a voltage supply;
- first and second clamping transistors, each has its collector-emitter path connected across a respective one of the loads; and
- a clamping control circuit, responsive to an input signal, for producing and applying to base electrodes of the first and second clamping transistors variable control signals to clamp output signal swings across the first and second loads.

9. A semiconductor memory arrangement, in accordance with claim 8, wherein
the control signals change with the D.C. voltage level of the input signal.

10. A semiconductor memory arrangement, in accordance with claim 8, wherein
the control signals vary with the magnitude of the input signal.

11. A semiconductor memory arrangement, in accordance with claim 8, wherein
output signal swings vary in response to the differences in the control signals.

12. A differential amplifier, in accordance with claim 8, wherein
the first and second clamping transistors, when operated, are operated continuously with voltage gain in a linear region of their operating characteristics.

* * * * *